(12) United States Patent
Sumino et al.

(10) Patent No.: US 9,318,634 B2
(45) Date of Patent: Apr. 19, 2016

(54) VINYLIDENE FLUORIDE RESIN COMPOSITION, RESIN FILM, BACK SHEET FOR SOLAR CELLS, AND SOLAR CELL MODULE

(75) Inventors: Tatsunori Sumino, Isesaki (JP); Fukumu Komoda, Isesaki (JP); Koji Nakajima, Isesaki (JP)

(73) Assignee: Denka Company Limited, Tokyo (JP)

( * ) Notice: Subject to any disclaimer, the term of this patent is extended or adjusted under 35 U.S.C. 154(b) by 142 days.

(21) Appl. No.: 14/131,669

(22) PCT Filed: Jul. 12, 2012

(86) PCT No.: PCT/JP2012/067828
§ 371 (c)(1),
(2), (4) Date: Jan. 8, 2014

(87) PCT Pub. No.: WO2013/008885
PCT Pub. Date: Jan. 17, 2013

(65) Prior Publication Data
US 2014/0137936 A1 May 22, 2014

(30) Foreign Application Priority Data
Jul. 13, 2011 (JP) .................... 2011-155248

(51) Int. Cl.
| | |
|---|---|
| *C08K 3/00* | (2006.01) |
| *H01L 31/048* | (2014.01) |
| *C09J 131/04* | (2006.01) |
| *C08K 3/22* | (2006.01) |
| *C08K 5/00* | (2006.01) |
| *C08L 27/16* | (2006.01) |
| *C08L 33/12* | (2006.01) |
| *H01L 31/049* | (2014.01) |
| *C08K 5/526* | (2006.01) |
| *C08K 13/02* | (2006.01) |

(52) U.S. Cl.
CPC .............. *H01L 31/0481* (2013.01); *C08K 3/22* (2013.01); *C08K 5/005* (2013.01); *C08L 27/16* (2013.01); *C08L 33/12* (2013.01); *C09J 131/04* (2013.01); *H01L 31/049* (2014.12); *C08K 5/526* (2013.01); *C08K 13/02* (2013.01); *C08K 2003/2237* (2013.01); *C08K 2003/2241* (2013.01); *Y02E 10/50* (2013.01)

(58) Field of Classification Search
CPC .................................................. H01L 31/0487
USPC .......................................................... 524/595
See application file for complete search history.

(56) References Cited

U.S. PATENT DOCUMENTS

| | | | | |
|---|---|---|---|---|
| 5,922,493 | A | 7/1999 | Humphrey, Jr. et al. | 429/316 |
| 8,722,791 | B2 * | 5/2014 | Saito et al. | 524/520 |
| 8,895,140 | B2 * | 11/2014 | Yoshimura et al. | 428/328 |
| 2011/0223419 | A1 * | 9/2011 | Okawara et al. | 428/355 EN |

FOREIGN PATENT DOCUMENTS

| | | |
|---|---|---|
| CN | 1137178 A | 12/1996 |
| CN | 101681946 A | 3/2010 |
| EP | 0 658 943 A1 | 6/1995 |
| EP | 0 730 316 A1 | 9/1996 |
| EP | 1 000 977 A1 | 5/2000 |
| JP | 60-059114 A | 4/1985 |
| JP | 62-59114 A | 3/1987 |
| JP | 01-297450 A | 11/1989 |
| JP | 11-172064 A | 6/1999 |
| JP | 2000-174296 A | 6/2000 |
| JP | 2002-83978 A | 3/2002 |
| JP | 2002-338706 A | 11/2002 |
| JP | 2004-39569 A | 2/2004 |
| JP | 2008-028294 A | 2/2008 |
| JP | 2009-71236 A | 4/2009 |
| JP | 2011-18851 A | 1/2011 |
| WO | WO 2004/006363 A1 | 1/2004 |
| WO | WO 2008/157159 A1 | 12/2008 |

OTHER PUBLICATIONS

International sear Report mailed Sep. 11, 2012, issued in corresponding International Patent Application Serial No. PCT/JP2012/067828.

\* cited by examiner

*Primary Examiner* — Hannah Pak
(74) *Attorney, Agent, or Firm* — Stein IP, LLC

(57) ABSTRACT

Provided is a vinylidene fluoride resin composition resistant to yellowing in the test for evaluation of durability of moist heat resistance, even when it is laminated directly on an ethylene vinyl acetate copolymer (EVA)-based sealing material, and a resin film, a back sheet for solar cells and a solar cell module comprising the same. A vinylidene fluoride resin composition at least comprising a vinylidene fluoride resin having a peak value ratio of head-to-tail bond to head-to-head bond (head-to-tail bond/head-to-head bond), as determined by $^1$H-NMR, of 11.5 or less and a mass-average molecular weight (Mw) of $1.30 \times 10^5$ or more, and an antioxidant is processed into a vinylidene fluoride resin film having a thickness of 10 to 200 µm. The vinylidene fluoride resin film and an electric insulating resin film such as polyethylene terephthalate-based film are laminated, to give a back sheet for solar cells.

15 Claims, 1 Drawing Sheet

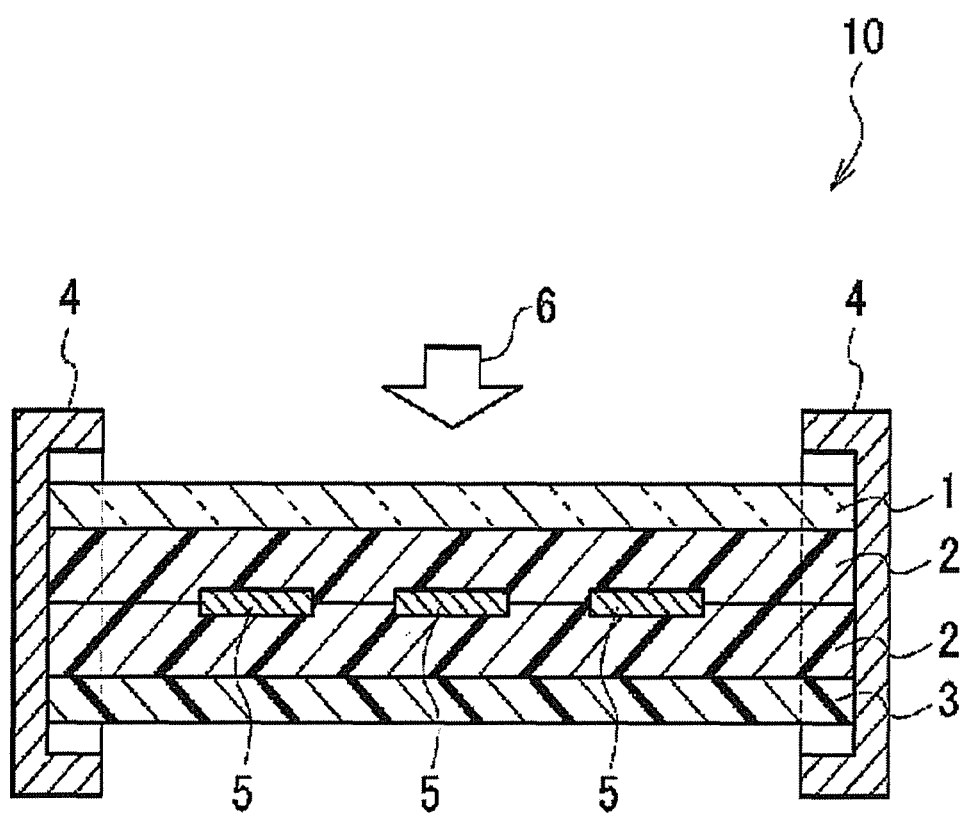

VINYLIDENE FLUORIDE RESIN COMPOSITION, RESIN FILM, BACK SHEET FOR SOLAR CELLS, AND SOLAR CELL MODULE

CROSS-REFERENCE TO RELATED APPLICATIONS

This application is a national stage of International Application No. PCT/JP2012/067828, filed Jul. 12, 2012 in the U.S. Patent and Trademark Office. This application claims the benefit of Japanese Application No. 2011-155248, filed Jul. 13, 2011, in the Japanese Patent Office. All disclosures of the document(s) named above are incorporated herein by reference.

BACKGROUND OF THE INVENTION

1. Field of the Invention

The present invention relates to a vinylidene fluoride resin composition and a resin film, a back sheet for solar cells, and a solar cell module comprising the resin composition. More specifically, it relates to a technology for preventing discoloration of resin films for use in applications demanding weather resistance, such as solar cell modules.

2. Description of the Related Art

Various natural energies have been used more frequently recently for reduction of release of carbon dioxide to overcome the problem of global warming and, in particular, solar cells that utilize solar energy are attracting attention. However, solar cell modules, which are used outdoors for an extended period of time, have to satisfy stricter requirement on durability. Thus, the solar cells generally have a structure in which they are sealed with a thermoplastic resin such as an ethylene vinyl acetate copolymer (EVA) resin and held additionally as protected between glass on the sunlight-incoming face and a back sheet on the other face.

Vinylidene fluoride resins superior in mechanical strength, chemical resistance, and weather resistance are attracting attention as the weather-resistant resin film materials for preparation of the back sheets for protection of the rear-face of the solar cell modules. And, a solar cell module having a laminate film of a vinylidene fluoride resin film and a polyethylene terephthalate film as the back sheet and a solar cell module having a laminate film of a transparent highly moisture-proof film with an inorganic oxide coated thereon have been proposed (see, for example, Patent Documents 1 and 2).

The back sheet is formed as the lowest layer in the solar cell module for protection of the solar cell and its wiring, and a white sheet is occasionally used, in addition for the protection described above, for improvement of reflectance of sunlight and thus of power-generating efficiency of the solar cell module (see, for example, Patent Documents 3 and 4). Such a white vinylidene fluoride resin film is prepared, for example, by blending a white pigment such as titanium oxide to a vinylidene fluoride resin composition and filming the blend.

CITATION LIST

Patent Literatures

[Patent Document 1] JP-A No. 2002-83978
[Patent Document 2] JP-A No. 2000-174296
[Patent Document 3] JP-A No. 2009-71236
[Patent Document 4] JP-A No. 2008-28294

SUMMARY OF THE INVENTION

Technical Problem

Generally, an EVA resin is used as the sealing material for sealing solar cells and a back sheet of a vinylidene fluoride resin film is applied on the EVA-based sealing material by thermal compression. However, such a solar cell module having a structure in which an EVA-based sealing material and a vinylidene fluoride resin film are in direct contact with each other had a problem that the back sheet (vinylidene fluoride resin film) discolors to yellow easily when it is subjected to a durability test under high-temperature high-humidity condition.

Accordingly, a major object of the present invention is to provide a vinylidene fluoride resin composition that is resistant to discoloration in the test for evaluation of durability of moist heat resistance, even when it is laminated directly on an ethylene vinyl acetate copolymer (EVA)-based sealing material, and a resin film, a back sheet for solar cells, and a solar cell module prepared from the same.

Solution to Problem

After intensive studies to overcome the problems above, the inventors have found that the discoloration of the vinylidene fluoride resin film is caused by a hindered amine-based photostabilizer contained in the EVA resin for solar cell modules used as the sealing material. Specifically, it was found that, when such a solar cell module is placed in high-temperature high-humidity environment for an extended period of time, the hindered amine-based photostabilizer contained in the EVA resin generates an alkaline atmosphere locally at the interface between the EVA-based sealing material and the vinylidene fluoride resin film, causing defluorination reaction in the vinylidene fluoride resin film, and thus forming a polyene structure.

The inventors have studied the method for preventing generation of the alkaline atmosphere at the interface between the EVA-based sealing material and the vinylidene fluoride resin film and found that it is possible to reduce significantly the discoloration of the vinylidene fluoride resin film during the test for evaluation of durability of moist heat resistance, by making the vinylidene fluoride resin film contain a vinylidene fluoride resin in a particular structure and an antioxidant, and made the present invention.

Specifically, the vinylidene fluoride resin composition according to the present invention at least comprises a vinylidene fluoride resin having a peak value ratio of head-to-tail bond to head-to-head bond (head-tail bond/head-to-head bond), as determined by $^1$H-NMR, of 11.5 or less and a mass-average molecular weight (Mw) of $1.30 \times 10^5$ or more and an antioxidant.

The vinylidene fluoride resin composition may contain the vinylidene fluoride resin in an amount of 50 mass % or more with respect to the total mass of the resin components.

The antioxidant may be added, for example, in an amount of 0.01 to 5 parts by mass with respect to 100 parts by mass of the resin components.

On the other hand, the vinylidene fluoride resin composition may contain, in addition to the vinylidene fluoride resin, a methacrylic ester resin as another resin component in an amount in the range of 5 to 50 mass % with respect to the total mass of the resin components.

Titanium oxide may also be added in an amount of 5 to 30 parts by mass with respect to 100 parts by mass of the resin components.

The vinylidene fluoride resin film according to the present invention is made of the vinylidene fluoride resin composition described above and has a thickness of 10 to 200 μm.

In addition, the back sheet for solar cells according to the present invention comprises the vinylidene fluoride resin film described above.

Further, the solar cell module according to the present invention comprises the solar cell back sheet.

Advantageous Effects of Invention

It is possible according to the present invention to provide a vinylidene fluoride resin film resistant to yellowing during a test for evaluation of durability of moist heat resistance, even when it is laminated directly on an ethylene vinyl acetate copolymer (EVA)-based sealing material, as it contains a vinylidene fluoride resin having a particular structure and an antioxidant.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 1 is a schematic cross-sectional view illustrating the structure of a solar cell module in the fourth embodiment of the present invention.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

First Embodiment

First, a vinylidene fluoride resin composition (hereinafter, referred to simply as resin composition) in the first embodiment of the present invention will be described. The resin composition in the present embodiment at least comprises a vinylidene fluoride resin (PVDF resin) having a particular molecular chain structure and a molecular weight and additionally an antioxidant.

[Resin Component]

In the resin composition of the present embodiment, 50 mass % or more of the resin component is a PVDF resin. It is a homopolymer PVDF resin having a ratio R of head-to-tail bond to head-to-head bond in the molecular chain (=head-to-tail bond/head-to-head bond) of 11.5 or less and a mass-average molecular weight (Mw) of $1.30\times10^5$ or more. It is possible, by adding a PVDF resin in such a molecular chain structure, to prevent generation of the alkaline atmosphere and suppress discoloration to yellow in the test for evaluation of long-term durability of moist heat resistance when it is used as a back sheet for solar cell.

It is possible to determine whether the PVDF resin is a homopolymer or not by $^{19}$F-NMR. The ratio R is the ratio of the peak value of head-to-tail bond (2.87 ppm) to that of head-to-head bond (1.0 ppm), as determined by $^1$H-NMR under a common test condition (solvent: DMSO-$d_5$, measurement temperature: 60° C., and measurement frequency: 500 MHz).

Alternatively, the mass-average molecular weight (Mw) can be determined by GPC (gel permeation chromatography). The measurement condition then is, for example, as follows: eluant: N,N'-dimethylformamide (containing 10-mmol/L lithium bromide), standard substance: polyethylene oxide, polyethylene glycol, and column temperature: 50° C.

On the other hand, when the ratio R of head-to-tail bond to head-to-head bond in the molecular chains of the PVDF resin (=head-to-tail bond/head-to-head bond) is more than 11.5 or when the mass-average molecular weight (Mw) of the PVDF resin is less than $1.30\ 10^5$, the PVDF resin becomes more vulnerable to discoloration to yellow in the test for evaluation of durability described below and thus it is not possible to obtain the advantageous effects described above. Preferably, the bond ratio R of the PVDF resin is 8.0 or more and the mass-average molecular weight (Mw) of the PVDF resin is $2.00\times10^5$ or less from the viewpoint of filming efficiency.

The content of the PVDF resin having such a molecular chain structure and a molecular weight is not particularly limited, but preferably 50 mass % or more with respect to the total mass of the resin components. It is thus possible to improve the yellowing-suppressing efficiency.

The resin composition in the present embodiment may contain a methacrylic ester resin together with the PVDF resin described above. In such a case, the blending rate of the methacrylic ester resin is preferably 5 to 50 mass % with respect to the total mass of the resin components. Such addition of a methacrylic ester resin leads to improvement of adhesiveness to other materials.

The methacrylic ester resin blended to the resin composition of the present embodiment is a homopolymer of methyl methacrylate or a copolymer of methyl methacrylate and other monomers (less than 50 mass %). Examples of the monomers copolymerizable with methyl methacrylate include methacrylic esters having a carbon number of 2 to 4, acrylic esters having a carbon number of 1 to 8 such as methyl acrylate and butyl acrylate, styrene, α-methylstyrene, acrylonitrile, acrylic acid, other ethylenic unsaturated monomers, and the like.

The resin composition in the present embodiment may contain, as needed in the range that the advantageous effects of the present invention are not impaired, PVDF resins different from the PVDF resin described above having a particular molecular chain structure and a molecular weight and also resins different from the methacrylic ester resin.

[Antioxidant]

The resin composition in the present embodiment contains an antioxidant together with the PVDF resin described above having a particular molecular chain structure and a molecular weight. It is thus possible to suppress significantly discoloration to yellow in the test for evaluation of long-term durability of moist heat resistance, when it is used as the rear-face protection sheet in solar cells. The antioxidant blended to the resin composition in the present embodiment may be any phenol-based antioxidant having a role as radical scavenger or any phosphite-based antioxidant having a role as peroxide decomposer and combined used of them may provide a synergic effect.

Typical examples of the phenol-based antioxidants include: 2,6-di-tert-butyl-4-methylphenol, n-octadecyl-3-(3', 5'-di-tert-butyl-4'-hydroxyphenyl) propionate, tetrakis-[methylene-3-(3',5'-di-tert-butyl-4-hydroxyphenyl)propionate]

methane, tris(3,5-di-tert-butyl-4-hydroxybenzyl) isocyanurate, triethylene glycol-bis-[3-(3-tert-butyl-4-hydroxy-5-methylphenyl)propionate], 2,2'-methylene bis-(4-methyl-6-tert-butylphenol), 4-4'-thiobis-(3-methyl-6-tert-butylphenol), 4-4'-butylidene bis-(3-methyl-6-tert-butylphenol), and the like.

Alternatively, examples of the phosphite-based antioxidants include trisnonylphenyl phosphite, distearyl pentaerythritol diphosphite, tris(2,4-di-tert-butylphenyl) phosphite, tetrakis(2,4-di-tert-butylphenyl)-4,4'-biphenylene diphosphite, and the like.

The amount of the antioxidant blended is not particularly limited, but, it is preferably 0.01 to 5 parts by mass and more preferably 0.1 to 2 parts by mass, with respect to 100 parts by mass of the resin components, from the viewpoints of yellowing-suppressing efficiency and production cost.

[Titanium Oxide]

The resin composition in the present embodiment may contain titanium oxide additionally. As PVDF resins are superior in weather resistance, the resin films themselves are sufficiently resistant to weathering, but addition of titanium oxide thereto can increase reflectance of sunlight and also the power-generating efficiency of a solar cell module when such a PVDF resin is used as the back sheet for solar cell.

However when the amount of titanium oxide blended is less than 5 parts by mass with respect to 100 parts by mass of the resin components, it may not lead to sufficient increase of reflectance of sunlight. Alternatively, when titanium oxide is added in an amount more than 30 parts by mass with respect to 100 parts by mass of the resin components, it may not be dispersed uniformly in the resin composition, making it difficult to produce its film. Accordingly, the titanium oxide is preferably added in an amount of 5 to 30 parts by mass with respect to 100 parts by mass of the resin components.

The titanium oxide blended to the resin composition in the present embodiment is preferably a rutile or anatase crystal prepared by the chloride or sulfate salt method. For example when titanium oxide is produced by the chloride method, $TiCl_4$ is oxidized and converted to $TiO_2$ particles. Alternatively when titanium oxide ($TiO_2$) is produced by the sulfate salt method, an ore containing sulfuric acid and titanium is first dissolved and the resulting solution is processed in a series of steps to give $TiO_2$.

Practically, it is advantageous to use a titanium oxide in a rutile crystalline structure that is resistant to discoloration due to degradation by weathering. It is particularly advantageous to use a titanium oxide having an inorganic coat layer formed as the outmost layer for improvement of dispersion in the resin composition and reduction of resin decomposition.

The particle diameter, i.e., the average particle diameter as determined by sedimentation method, of the titanium oxide is preferably 0.05 to 2.0 µm. It is because, when the particle diameter of the titanium oxide is smaller than 0.05 µm, the PVDF layer becomes more transparent, as visible light can pass through it and, when the particle diameter of titanium oxide is larger than 2 µm, the particles become less dispersible and aggregates easily in the resin composition.

The resin composition in the present embodiment may contain, in addition to the titanium oxide described above, inorganic pigments such as zinc oxide, zinc sulfide, and/or barium sulfate, and metal oxides other than titanium oxide for improvement of shielding property. Further, the resin composition in the present embodiment may contain, in addition to the components described above, antioxidants, dispersants, coupling agents, heat-stabilizer, surfactants, antistatic agents, anti-fogging agents, ultraviolet absorbents, and the like.

As described above in detail, the vinylidene fluoride resin composition in the present embodiment is superior in filming efficiency, as it contains a PVDF resin having a particular molecular chain structure and a molecular weight, and an antioxidant, and thus, gives a vinylidene fluoride resin film resistant to yellowing in the test for evaluation of durability of moist heat resistance, even when it is laminated directly on an EVA-based sealing material.

Second Embodiment

Hereinafter, a vinylidene fluoride resin film (hereinafter, referred to simply as resin film) in the second embodiment of the present invention will be described. The resin film in the present embodiment, which is prepared by filming the resin composition of the first embodiment described above, has a thickness of 10 to 200 µm. When the thickness of the resin film is less than 10 µm, the mechanical strength may become insufficient, while, when it is more than 200 µm, the filming efficiency may decline.

[Production Method]

The method for production of the resin film in the present embodiment is not particularly limited and the resin film can be prepared by a common method, for example, of molding the resin composition in the first embodiment by melt extrusion. Among various filming methods available, a filming method by means of an extruder equipped with a T die for film production is preferable. A resin composition previously melt-kneaded may be used as the raw material. Alternatively, individual raw materials may be supplied directly to a uniaxial or biaxial extruder, as they are blended, melted therein for example at a temperature of 150 to 260° C. and extruded into a film through a T die for film production.

The vinylidene fluoride resin film in the present embodiment, which contains a PVDF resin having a particular molecular chain structure and a molecular weight, and an antioxidant, can prevent generation of the alkaline atmosphere, even when it is laminated directly on an EVA-based sealing material. For that reason, the vinylidene fluoride resin film in the present embodiment is resistant to yellowing even when the durability test is carried out under high temperature high-humidity environment for an extended period of time and thus extremely useful as a back sheet for solar cells.

Third Embodiment

Hereinafter, a back sheet for solar cells (hereinafter, referred to simply as back sheet) in the third embodiment of the present invention will be described. The back sheet in the present embodiment is prepared, as the vinylidene fluoride resin film in the second embodiment described above and an electric insulating resin film, such as polyethylene terephthalate (PET)-based film are laminated and bonded to each other.

These films can be bonded to each other with various kinds of adhesives. Another resin film for, such as a PET-based film, is laminated on the back sheet to provide it with electrically insulating properties, shielding property and steam-blocking properties (moisture proofness).

The back sheet in the present embodiment, which comprises a vinylidene fluoride resin film containing a PVDF resin having a particular molecular chain structure and a molecular weight, and an antioxidant, prevents generation of the alkaline atmosphere, even when laminated directly on an EVA-based sealing material. For that reason, the face of the back sheet in contact with the EVA-based sealing material is extremely resistant to yellowing, even if the test for evaluation of durability of moist heat resistance is carried out for an extended period of time.

Fourth Embodiment

Hereinafter, a solar cell module in the fourth embodiment of the present invention will be described. FIG. 1 is a schematic cross-sectional view showing the structure of the solar cell module in the present embodiment. As shown in FIG. 1, the solar cell 5, a photovoltaic element, in the solar cell module 10 in the present embodiment is sealed with EVA-based sealing materials 2.

The solar cell module additionally has a transparent plate 1 for example of glass laminated on the face exposed to sunlight 6 and a back sheet 3 of the third embodiment described above on the rear face and is held with frames 4. The EVA-based sealing material 2 and the back sheet 3 can be bonded to each other by heat press at 100 to 150° C.

As the back sheet 3 in the solar cell module 10 in the present embodiment comprises a vinylidene fluoride resin film containing a PVDF resin having a particular molecular chain structure and a molecular weight, and an antioxidant, it is resistant to yellowing of the back sheet 3 in the test for evaluation of durability of moist heat resistance, even though the back sheet 3 is laminated directly on the EVA-based sealing material 2.

EXAMPLES

Hereinafter, the advantageous effects of the present invention will be described with reference to Examples and Comparative Examples of the present invention. In the Examples below, vinylidene fluoride resin films of the Examples and the Comparative Examples were prepared and the moist heat resistance thereof evaluated by the methods shown below.

<Raw Materials>

(1) Vinylidene Fluoride (PVDF) Resin

PVDF resins shown in following Table 1 were used. Here, PVDF resins Nos. A to F shown in the following Table 1 are all homopolymers.

TABLE 1

| No. | Polymerization method | Mass-average molecular weight (Mw) | Ratio of head-to-tail bond/head-to-head bond (R) |
|---|---|---|---|
| A | Emulsion polymerization | $1.74 \times 10^5$ | 10.7 |
| B | Emulsion polymerization | $1.45 \times 10^5$ | 11.2 |
| C | Emulsion polymerization | $1.26 \times 10^5$ | 10.6 |
| D | Emulsion polymerization | $0.95 \times 10^5$ | 11.2 |
| E | Suspension polymerization | $1.34 \times 10^5$ | 12.1 |
| F | Suspension polymerization | $1.04 \times 10^5$ | 11.9 |

(2) Methacrylic Ester-Based Resin (HIPET HBS000, Produced by Mitsubishi Rayon Co., Ltd.):

A methacrylic ester-based resin containing butyl acrylate (n-BA) and butyl methacrylate (BMA) as rubber components. MFR (230° C., 10 kg-load): 4 to 7 g/10 minutes.

(3) Titanium Oxide (R960, Produced by E. I. Du Pont De Nemours and Company):

Particle diameter: about 0.35 μm, pure titanium content: about 89 mass %.

(4) Antioxidant (2112, Produced by ADEKA Corporation):

A phosphite-based antioxidant.

<Method for Preparing Test Sample>

Example 1

A mixture of 100 parts by mass of the vinylidene fluoride resin No. A, 22 parts by mass of titanium oxide, and 1 part by mass of the antioxidant were first kneaded in a φ30 mm biaxial extruder, to give a compound. The compound was then extruded through a T die from a φ40 mm uniaxial extruder at an extrusion temperature of 250° C., to give a film having a thickness of 30 μm.

Example 2

A mixture of 100 parts by mass of the resin components containing 80 mass % of the vinylidene fluoride resin No. A and 20 mass % of the methacrylic ester-based resin, 22 parts by mass of titanium oxide, and 1 part by mass of the antioxidant was processed by a method under a condition similar to those described above in Example 1, to give a film having a thickness of 30 μm.

Example 3

A film having a thickness of 30 μm was prepared by a method under a condition similar to those described above in Example 2, except that the vinylidene fluoride resin No. B was used.

Comparative Example 1

A film having a thickness of 30 μm was prepared by a method under a condition similar to those described above in Example 2, except that the vinylidene fluoride resin No. C was used.

Comparative Example 2

A film having a thickness of 30 μm was prepared by a method under a condition similar to those described above in Example 3, except that no antioxidant was blended.

Comparative Examples 3 to 5

A film having a thickness of 30 μm was prepared by a method under a condition similar to those described above in Example 2, except that one of the vinylidene fluoride resins Nos. D to F was used.

<Test Method>

(Properties of PVDF Resins)

(1) Ratio R (Head-to-Tail Bond/Head-to-Head Bond)

The ratio R of each of the PVDF resins Nos. A to F used in Examples and Comparative Examples was determined on an analytical instrument under a measurement condition described below and the ratio of head-to-tail bond to head-to-head bond (R value) was calculated from the ratio of the peak value at 2.87 ppm to that at 1.0 ppm.

Analytical instrument: NMR (Bruker AVANCE III 500)
Nuclear species: $^1$H (-NMR)
Solvent: DMSO-$d_6$
Measurement temperature: 60° C.
Measurement frequency: 500 MHz (b) Mass-Average Molecular Weight (Mw)

The mass-average molecular weight (Mw) of each of the PVDF resins Nos. A to F used in Examples and Comparative Examples was determined on a GPC instrument under the following measurement condition:

Column: Shodex GPC KD-806x2+KD802
Eluant: N,N'-dimethylformamide (containing 10 mmol/L lithium bromide)
Standard substances: polyethylene oxide and polyethylene glycol
Column temperature: 50° C.

(Moist Heat Resistance of Films)

A 10 cm square sample was cut out of each of the resin films of Examples and Comparative Examples prepared by the method described above and bonded to an EVA resin film for solar cell modules (EVA-based sealing material) by means of a pressing machine under the condition of a heating temperature of 230° C. and a pressure of 5 MPa, to give a laminate. A 1000-hour damp heat test of the sample thus obtained for evaluation of the moist heat resistance was carried out according to JIS C8990 in a weathering machine under the condition of a temperature of 85° C.±2° C. and a relative humidity of 85%±5%.

The yellowing of the film on the face in contact with EVA was determined according to JIS K7105 by color difference measurement and a value ΔYI (yellow index) was calculated and used for evaluation. When ΔYI is 10 or less, the sample was considered to be at a level practically without any problem. The results are summarized in the following Table 2.

The results above show that it is possible according to the present invention to provide a vinylidene fluoride resin film resistant to yellowing in the test for evaluation of durability of moist heat resistance, even when it is laminated directly on a sealing material of an ethylene vinyl acetate copolymer resin.

REFERENCE SIGNS LIST

1: Transparent plate
2: EVA-based sealing material
3: Back sheet
4: Frame
5: Solar cell
6: Sunlight
10: Solar cell module Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. A vinylidene fluoride resin composition, comprising a vinylidene fluoride resin and an antioxidant, wherein
the vinylidene fluoride resin has a peak value ratio of head-to-tail bond to head-to-head bond (head-to-tail bond/head-to-head bond), as determined by $^1$H-NMR$_1$ of 11.5 or less and a mass-average molecular weight (Mw) of $1.30 \times 10^5$ or more, and the antioxidant is present in an

TABLE 2

|  |  | Example 1 | Example 2 | Example 3 | Comparative Example 1 | Comparative Example 2 | Comparative Example 3 | Comparative Example 4 | Comparative Example 5 |
| --- | --- | --- | --- | --- | --- | --- | --- | --- | --- |
| PVDF resin | Kind | A | A | B | C | B | D | E | F |
|  | Blending amount (parts by mass) | 100 | 80 | 80 | 80 | 80 | 80 | 80 | 80 |
| PMMA resin (parts by mass) |  | — | 20 | 20 | 20 | 20 | 20 | 20 | 20 |
| Titanium oxide (parts by mass) |  | 22 | 22 | 22 | 22 | 22 | 22 | 22 | 22 |
| Antioxidant (parts by mass) |  | 1 | 1 | 1 | 1 | — | 1 | 1 | 1 |
| Moist heat resistance (ΔYI) |  | 6.54 | 6.75 | 7.48 | 12.50 | 10.51 | 14.89 | 28.52 | 36.64 |

As shown in Table 2 above, the resin films of Examples 1 to 3, which were prepared within the scope of the present invention, were significantly more resistant to yellowing than the resin films of Comparative Examples 1 to 5. Specifically, when Example 2 and Comparative Example 1 and also Example 3 and Comparative Example 3, in which the PVDF resins used had a similar ratio of head-to-tail bond to head-to-head bond (R), are compared respectively, the samples of Examples 2 and 3, in which the PVDF resin had a mass-average molecular weight of $1.30 \times 10^5$ or more, were more resistant to yellowing than those of Comparative Examples 1 and 3, in which the PVDF resin had a mass-average molecular weight of less than $1.30 \times 10^5$.

Alternatively when Example 3 and Comparative Example 4, in which the PVDF resins used had a similar molecular weight, are compared, the sample of Example 3, in which the PVDF resin had a ratio of head-to-tail bond to head-to-head bond (R) of 11.5 or less, was more resistant to yellowing than the sample of Comparative Example 4, in which the PVDF resin had a ratio of head-to-tail bond to head-to-head bond (R) of more than 11.5.

amount of 0.01 to 5 parts by mass with respect to 100 parts by mass of the resin components.

2. The vinylidene fluoride resin composition according to claim 1, comprising the vinylidene fluoride resin in an amount of 50 mass % or more with respect to the total mass of the resin components.

3. The vinylidene fluoride resin composition according to claim 2, comprising a methacrylic ester resin in an amount of 5 to 50 mass % with respect to the total mass of the resin components.

4. The vinylidene fluoride resin composition according to claim 1, comprising titanium oxide in an amount of 5 to 30 parts by mass with respect to 100 parts by mass of the resin components.

5. A vinylidene fluoride resin film prepared of the vinylidene fluoride resin composition according to claim 1, having a thickness of 10 to 200 μm.

6. A back sheet for solar cell modules, comprising the vinylidene fluoride resin film according to claim 5.

7. A solar cell module, comprising the back sheet according to claim 6.

8. The vinylidene fluoride resin composition according to claim 1, comprising a methacrylic ester resin in an amount of 5 to 50 mass % with respect to the total mass of the resin components.

9. The vinylidene fluoride resin composition according to claim 2, comprising titanium oxide in an amount of 5 to 30 parts by mass with respect to 100 parts by mass of the resin components.

10. The vinylidene fluoride resin composition according to claim 1, comprising titanium oxide in an amount of 5 to 30 parts by mass with respect to 100 parts by mass of the resin components.

11. The vinylidene fluoride resin composition according to claim 3, comprising titanium oxide in an amount of 5 to 30 parts by mass with respect to 100 parts by mass of the resin components.

12. A vinylidene fluoride resin film prepared of the vinylidene fluoride resin composition according to claim 2, having a thickness of 10 to 200 μm.

13. A vinylidene fluoride resin film prepared of the vinylidene fluoride resin composition according to claim 1, having a thickness of 10 to 200 μm.

14. A vinylidene fluoride resin film prepared of the vinylidene fluoride resin composition according to claim 3, having a thickness of 10 to 200 μm.

15. A vinylidene fluoride resin film prepared of the vinylidene fluoride resin composition according to claim 4, having a thickness of 10 to 200 μm.

* * * * *